(12) United States Patent
Hirao (10) Patent No.: US 7,795,144 B2
(45) Date of Patent: Sep. 14, 2010

(54) METHOD FOR FORMING ELECTRODE STRUCTURE FOR USE IN LIGHT EMITTING DEVICE AND METHOD FOR FORMING STACKED STRUCTURE

(75) Inventor: Naoki Hirao, Kanagawa (JP)

(73) Assignee: Sony Corporation, Tokyo (JP)

( * ) Notice: Subject to any disclaimer, the term of this patent is extended or adjusted under 35 U.S.C. 154(b) by 164 days.

(21) Appl. No.: 12/127,620

(22) Filed: May 27, 2008

(65) Prior Publication Data

US 2008/0305631 A1 Dec. 11, 2008

(30) Foreign Application Priority Data

Jun. 6, 2007 (JP) ............................ P2007-149877

(51) Int. Cl.
*H01L 21/44* (2006.01)

(52) U.S. Cl. ............... 438/679; 438/670; 257/E21.025; 257/E21.235; 257/E21.171

(58) Field of Classification Search ................ 438/605, 438/606, 679, 670; 257/E21.025, E21.034, 257/E21.038, E21.169, E21.171, E21.172, 257/E21.235, E21.477, E21.478
See application file for complete search history.

(56) References Cited

U.S. PATENT DOCUMENTS

| | | | | |
|---|---|---|---|---|
| 4,771,017 A | * | 9/1988 | Tobin et al. | 438/98 |
| 4,839,310 A | * | 6/1989 | Hollis et al. | 438/173 |
| 4,927,782 A | * | 5/1990 | Davey et al. | 438/172 |
| 6,852,615 B2 | * | 2/2005 | Micovic et al. | 438/604 |
| 2003/0227027 A1 | * | 12/2003 | Micovic et al. | 257/192 |

FOREIGN PATENT DOCUMENTS

| | | |
|---|---|---|
| JP | 01-246830 | 10/1989 |
| JP | 05-129220 | 5/1993 |
| JP | 08-315981 | 11/1996 |
| JP | 11-220171 | 8/1999 |
| JP | 2005-314802 | 11/2005 |
| JP | 2006-332504 | 12/2006 |

OTHER PUBLICATIONS

Japanese Office Action issued on May 26, 2009, for corresponding Japanese Patent Application 2007-149877.

* cited by examiner

*Primary Examiner*—Caridad M Everhart
(74) *Attorney, Agent, or Firm*—K&L Gates LLP (57) ABSTRACT

A method for forming an electrode structure in a light emitting device is disclosed. The method includes the steps of: forming a mask material layer having an opening; depositing a first material layer on the mask material layer and on a portion of a compound semiconductor layer exposed through the bottom of the opening by a physical vapor deposition method reducing the particle density so that the mean free path for collision is long; depositing a second material layer on the first material layer on the mask material layer, on the first material layer deposited on the bottom of the opening, and on a portion of the compound semiconductor layer exposed through the bottom of the opening by a vapor deposition method other than the physical vapor deposition method; and removing the mask material layer and the first and second material layers deposited on the mask material layer.

4 Claims, 9 Drawing Sheets

FIG. 1A
STEP 110

FIG. 1B
STEP 120

FIG. 1C
STEP 130

FIG. 1D
STEP 140

STEP 180 (CONTINUED)

FIG. 4B

STEP 180 (CONTINUED)

METHOD FOR FORMING ELECTRODE STRUCTURE FOR USE IN LIGHT EMITTING DEVICE AND METHOD FOR FORMING STACKED STRUCTURE

CROSS-REFERENCE TO RELATED APPLICATIONS

The present application claims priority to Japanese patent Application No. 2007-149877 filed in the Japanese Patent Office on Jun. 6, 2007, the entire disclosure of which is incorporated herein by reference.

BACKGROUND

The present application relates to a method for forming an electrode structure for use in a light emitting device and a method for forming a stacked structure.

A light emitting device composed of, for example, a light emitting diode, generally has a stacked structure including a substrate, a first compound semiconductor layer of a first conduction type, an active layer, and a second compound semiconductor layer of a second conduction type. The first compound semiconductor layer, the active layer, and the second compound semiconductor layer are stacked on the substrate. The substrate or first compound semiconductor layer includes a first electrode formed thereon and the second compound semiconductor layer includes a second electrode formed thereon. With respect to the light emitting device, there have been known a light emitting device of a type such that light generated by the active layer passes through the second compound semiconductor layer and is emitted (hereinafter, frequently referred to as "light emitting device of type 2") and a light emitting device of a type such that the light passes through the first compound semiconductor layer and is emitted (hereinafter, frequently referred to as "light emitting device of type 1"). In the light emitting device of type 1, from the viewpoint of achieving improved light emission efficiency, it would be desirable that light generated by the active later passes through the second compound semiconductor layer and is reflected by the second electrode. Accordingly, silver (Ag) having a high optical reflectance is frequently used as the second electrode.

Silver (Ag) is likely to cause ion migration. When ion migration is caused in the second electrode composed of silver, short-circuiting disadvantageously occurs between the first compound semiconductor layer and the second compound semiconductor layer, so that it becomes that the active layer does not emit light.

A technique for preventing the ion migration has been known from, for example, Japanese Unexamined Patent Application Publication No. 11-220171. This patent document discloses a gallium nitride compound semiconductor device including a second electrode (p-side electrode) having a structure such that a first material layer composed of silver (Ag) is covered with a second material layer.

SUMMARY

The second electrode having the above structure is generally formed as follows. A resist layer having openings formed in the portions on which a first material layer is to be formed is formed on, for example, the second compound semiconductor layer by a photolithography technique, and a first material layer is formed on the entire surface by a vacuum evaporation method. Thereafter, the resist layer is removed by the first lift-off procedure, whereby a patterned first material layer is formed. Then, a resist layer having openings formed in the portions on which a second material layer is to be formed is formed again on the entire surface by a photolithography technique, and a second material layer is formed on the entire surface by a vacuum evaporation method. Thereafter, the resist layer is removed, whereby a patterned second material layer is formed.

With respect to the light emitting device or second electrode having a lager size (for example, on the order of millimeter), the two lift-off procedures described above are unlikely to cause severe problems. However, with respect to the light emitting device or second electrode having a small size (for example, on the order of several tens micrometer or smaller), the alignment of photomask in each of the two lift-off procedures requires high accuracy, and the operation of forming the second electrode using two lift-off procedures is cumbersome and results in increasing the production cost.

Accordingly, it is desirable to provide a method for forming an electrode structure for use in a light emitting device wherein the electrode structure is composed of a stacked structure including two layers, i.e., an upper layer and a lower layer wherein the lower layer is covered with the upper layer, wherein the method is advantageous in that the electrode structure is formed using a single lift-off procedure, and a method for forming a stacked structure.

In accordance with an embodiment there is provided a method for forming an electrode structure, composed of a first material layer and a second material layer, for use in a light emitting device (hereinafter, referred to simply as "the method for forming an electrode structure of an embodiment") which includes the steps of:

(A) forming a mask material layer on a compound semiconductor layer, the mask material layer having an opening having an average top diameter $R_T$ and an average bottom diameter $R_B$ (wherein $R_B > R_T$);

(B) depositing a first material layer composed of a conductive material on the mask material layer and on a portion of the compound semiconductor layer exposed through the bottom of the opening by a physical vapor deposition method reducing the particle density of a material to be deposited so that the mean free path for collision is long;

(C) depositing a second material layer on the first material layer on the mask material layer, on the first material layer deposited on the bottom of the opening, and on a portion of the compound semiconductor layer exposed through the bottom of the opening by a vapor deposition method other than the physical vapor deposition method; and (D) removing the mask material layer and the first and second material layers deposited on the mask material layer.

Thus, the electrode structure composed of the first material layer and the second material layer is formed.

In accordance with another embodiment, there is provided a method for forming a stacked structure, composed of a first material layer and a second material layer, (hereinafter, referred to simply as "the method for forming a stacked structure of an embodiment") which includes the steps of:

(A) forming a mask material layer including an opening on a base, the opening having an average top diameter $R_T$ and an average bottom diameter $R_B$ (wherein $R_B > R_T$);

(B) depositing a first material layer on the mask material layer and on a portion of the base exposed through the bottom of the opening by a physical vapor deposition method reducing the particle density of a material to be deposited so that the mean free path for collision is long;

(C) depositing a second material layer on the first material layer on the mask material layer, on the first material layer deposited on the bottom of the opening, and on a portion of the base exposed through the bottom of the opening by a vapor deposition method other than the physical vapor deposition method; and (D) removing the mask material layer and the first and second material layers deposited on the mask material layer.

Thus, the stacked structure composed of the first material layer and the second material layer is formed.

In the method for forming an electrode structure of an embodiment or method for forming a stacked structure of an embodiment, the physical vapor deposition (PVD) methods in the step (B), includes a vacuum evaporation method, an ion plating method, and an ion vapor deposition (IVD) method. The vapor deposition method in the step (C) includes a sputtering method, a plasma deposition method, and a chemical vapor deposition (CVD) method. Examples of vacuum evaporation methods include an electron beam heating deposition method, a resistive heating deposition method, and a flash deposition method. Examples of ion plating methods include a direct current (DC) method, an RF method, a multi-cathode method, an activation reaction method, a hollow cathode discharge (HCD) method, a field deposition method, an RF ion plating method, and a reactive ion plating method. Examples of sputtering methods include a diode sputtering method, a direct current sputtering method, a direct current magnetron sputtering method, a radio frequency sputtering method, a magnetron sputtering method, an ion beam sputtering method, and a bias sputtering method. Examples of CVD methods include an atmospheric pressure CVD method, a reduced pressure CVD, a thermal CVD method, a plasma CVD method, a photo CVD method, and a laser induced CVD method. By optimizing the conditions for deposition, namely, by controlling the mean free path or the like, the above deposition method may be used in the step (B) and the above deposition method may be used in the step (C).

In the method for forming an electrode structure of an embodiment or method for forming a stacked structure of an embodiment including the above preferred embodiments, examples of materials constituting the mask material layer include organic materials, such as a photoresist material, and inorganic materials. Examples of inorganic materials include $SiO_2$ materials, SiN materials, metals, and alloys. The mask material layer may be of a single-layer structure or stacked structure including an organic material layer, of a single-layer structure or stacked structure including an inorganic material layer, or of a stacked structure including an organic material layer and an inorganic material layer.

In the method for forming an electrode structure of an embodiment or method for forming a stacked structure of an embodiment (hereinafter, collectively referred to simply as "method according to embodiments") including the above preferred embodiment or configuration, from the viewpoint of facilitating the removal of the mask material layer and the first material layer and second material layer deposited on the mask material layer in the step (D), it is preferable that the mask material layer is subjected to plasma treatment, which varies depending on the material constituting the mask material layer, before performing the step (D), specifically, between the step (B) and the step (C), between the step (C) and the step (D), or between the step (B) and the step (C) and between the step (C) and the step (D). A gas used in the plasma treatment includes oxygen gas. Alternatively, using Ar gas or nitrogen gas, the mask material layer and the first material layer and second material layer deposited on the mask material layer may be physically removed.

For removing a kind of burr remaining at the edge of the second material layer, it is preferable that a plasma treatment, soft etching, or scrubbing, which varies depending on the material constituting the second material layer, is conducted after the step (D). Alternatively, the burr may be removed by polishing, such as chemical mechanical polishing (CMP).

Examples of materials constituting the first material layer include silver (Ag), copper (Cu), and alloys thereof. Examples of materials constituting the second material layer include conductive materials, such as nickel (Ni), titanium (Ti), tungsten (W), platinum (Pt), rhodium (Rh), palladium (Pd), vanadium (V), chromium (Cr), niobium (Nb), zinc (Zn), tantalum (Ta), molybdenum (Mn), hafnium (Hf), aluminum (Al), and alloys of these metals, and insulating materials, such as $SiO_2$, $SiN_x$, $Al_2O_2$, AlN, $TiO_2$, $Ta_2O_5$, and $ZrO_2$. The second material layer may be either of a single-layer structure or of a stacked structure composed of the above material or materials.

When the light emitting device includes a light emitting layer composed of a stacked structure including a first compound semiconductor layer of a first conduction type, an active layer, and a second compound semiconductor layer of a second conduction type, as an example of the compound semiconductor layer on which the mask material layer having an opening is formed in the method for forming an electrode structure of an embodiment, the second compound semiconductor layer used in the light emitting layer may be included. That is, the mask material layer including an opening may be formed on the second compound semiconductor layer used in the light emitting layer. The light emitting layer may be formed on a substrate. Further, examples of the compound semiconductor layers on which the mask material layer having an opening is formed in the method for forming an electrode structure of an embodiment include an n-type GaN layer doped with Si, an n-type InGaN layer doped with Si, a p-type GaN layer doped with Mg, a p-type InGaN layer doped with Mg, an n-type AlGaAs layer doped with (Te, Si), an n-type GaP layer doped with (Te, Si), an n-type AlGaInP layer doped with (Te, Si), an n-type InP layer doped With (Te, Si), a p-type AlGaAs layer doped with (Mg, Zn), a p-type GaP layer doped with (Mg, Zn), a p-type AlGaInP layer doped with (Mg, Zn), and a p-type InP layer doped with (Mg, Zn). Examples of the bases on which the mask material layer having an opening is formed in the method for forming a stacked structure of an embodiment include compound semiconductor layers, $SiO_2$, SiN, $TiO_2$, or $Al_2O_3$ formed on a semiconductor device, insulating layers, interlayer dielectric layers, and insulating films, each of which is composed of a resin and formed on a semiconductor device. For example, the mask material layer having an opening, may be formed on an insulating layer constituting a semiconductor device.

In the method for forming an electrode structure of an embodiment, when the light emitting device includes the stacked structure described above, the electrode structure including a first material layer and a second material layer constitutes a second electrode formed on the second compound semiconductor layer. Examples of substrates include a sapphire substrate, a GaAs substrate, a GaN substrate, an SiC substrate, an alumina substrate, a ZnS substrate, a ZnO substrate, an AlN substrate, an LiMgO substrate, an $LiGaO_2$ substrate, an $MgAl_2O_4$ substrate, an InP substrate, an Si substrate, and theses substrates each having a primary coat layer or buffer layer formed on the surface (principal surface) thereof. Examples of materials constituting the compound semiconductor layer or active layer include GaN compound semiconductors (including AlGaN mixed crystal, AlInGaN mixed crystal, and InGaN mixed crystal), InN compound semiconductors, AlN compound semiconductors, AlGaInP compound semiconductors, AlGaInAs compound semiconductors, GaInAs compound semiconductors, GaInAsP compound semiconductors, GaP compound semiconductors, and InP compound semiconductors. Examples of methods (deposition methods) for forming the first compound semiconductor layer, active layer, or second compound semiconductor layer include a metal organic chemical vapor deposition (MOCVD) method, a molecular beam epitaxy (MBE) method, and a hydride vapor deposition method in which a halogen contributes to the transport or reaction.

Examples of gas used in an MOCVD method for forming the compound semiconductor layer include gas widely known, such as trimethylgallium (TMG) gas, triethylgallium (TEG) gas, trimethylaluminum (TMA) gas, trimethylindium (TMI) gas, and arsine ($AsH_3$). Examples of nitrogen source gas include ammonia gas and hydrazine gas. For example, when silicon (Si) is added as an n-type impurity (n-type dopant), monosilane ($SiH_4$) gas may be used as an Si source, and, when selenium (Se) is added, $H_2Se$ gas may be used as an Se source. On the other hand, when magnesium (Mg) is added as a p-type impurity (p-type dopant), cyclopentadienylmagnesium gas, methylcyclopentadienylmagnesium, or biscyclopentadienylmagnesium ($Cp_2Mg$) may be used as an Mg source, and, when zinc (Zn) is added, dimethylzinc (DMZ) can be used as a Zn source. In addition to Si, examples of n-type impurities (n-type dopants) include Ge, Se, Sn, C, and Ti. In addition to Mg, examples of p-type impurities (p-type dopants) include Zn, Cd, Be, Ca, Ba, and O. In forming a red light-emitting device, examples of usable gas include trimethylaluminum (TMA), triethylaluminum (TEA), trimethylgallium (TMG), triethylgallium (TEG), trimethylindium (TMI), triethylindium (TEI), phosphine ($PH_3$), arsine, dimethylzinc (DMZ), diethylzinc (DEZ), $H_2S$, hydrogen selenide ($H_2Se$), and biscyclopentanediethylzinc.

The first electrode is formed on the substrate or first compound semiconductor layer. In other words, the first electrode may be lead from the active layer either in the direction opposite to the second electrode or in the direction of the second electrode. Specifically, the first electrode is connected to the first compound semiconductor layer, but, in the former case, the first electrode is formed on the bottom surface of the first compound semiconductor layer (the surface of the first compound semiconductor layer which is not on the side of the interface between the first compound semiconductor layer and the active layer) or formed on the back surface of the substrate (the surface of the substrate on which the first compound semiconductor layer is not formed), and, in the latter case, the first electrode is formed on a portion in which part of the second compound semiconductor layer and active layer is removed to expose part of the first compound semiconductor layer. The first electrode may be, for example, of a single-layer structure or multi-layer structure including at least one metal selected from the group consisting of gold (Au), silver (Ag), palladium (Pd), aluminum (Al), titanium (Ti), tungsten (W), copper (Cu), zinc (Zn), tin (Sn), and indium (In), specifically, the first electrode may be of a stacked structure including, e.g., Ti layer/Au layer, Ti layer/Al layer, Ti layer/Pt layer/Au layer, Pd layer/AuGe layer/Au layer, or Ti layer/Al layer/Pt layer/Au layer. The layer to the left of the "/" in the above examples of stacked structure is near the substrate. This applies to the descriptions below. The first electrode may be formed by either the method for forming an electrode structure of an embodiment the present application or a known method, and the method may be selected depending on the material constituting the first electrode. When the first electrode is formed by a known method, examples of the methods include PVD methods, such as a vacuum evaporation method and a sputtering method, and various CVD methods.

A pad electrode for providing an electrical connection with an external electrode or circuit may be formed on the second electrode or first electrode. It is preferable that the pad electrode has a single-layer structure or multi-layer structure including at least one metal selected from the group consisting of titanium (Ti), aluminum (Al), platinum (Pt), gold (Au), and nickel (Ni). The pad electrode may be of a multi-layer structure, such as a Ti/Pt/Au multi-layer structure or a Ti/Au multi-layer structure.

The plane form of the opening is not limited to the circular form, and the plane form may be, for example, a rectangular form, an elliptic form, an oblong form, a triangular form, a pentagonal or polygonal form, a rounded triangular form, a rounded rectangular form, a rounded polygonal form, or a grooved form. $R_T$ and $R_B$ are defined as diameters of the respective plane forms of the top and bottom of the opening, each of which is presumed to be a circle, specifically, then, are represented by the following formulae:

$$S_T = \pi \times (R_T/2)^2$$

$$S_B = \pi \times (R_B/2)^2$$

wherein $S_T$ represents an area of the top of the opening, and $S_B$ represents an area of the bottom of the opening.

The "PVD method reducing the particle density so that the mean free path for collision is long" used herein means a PVD method such that the material constituting the first material layer to be deposited by the PVD method has a mean free path of $1 \times 10$ m or more, preferably $1 \times 10^2$ m or more, more preferably $1 \times 10^3$ m or more under a pressure of $1 \times 10^{-3}$ Pa in the deposition atmosphere. The "other than the PVD method" used herein means a vapor deposition method such that the material constituting the second material layer to be deposited by the vapor deposition method has a mean free path of less than $1 \times 10$ m, preferably $1 \times 10^{-1}$ m or less, more preferably $1 \times 10^{-2}$ m or less under a pressure of $1 \times 10^{-3}$ Pa in the deposition atmosphere.

It is preferable that the mask material layer has an average thickness t which satisfies the following relationship:

$$1 \leq 2t/(R_B - R_T) \leq 10$$

but the average thickness $\underline{t}$ of the mask material layer is not limited to this.

A method for removing the mask material layer from the compound semiconductor layer or base may be appropriately selected depending on the type of the material constituting the mask material layer.

In the method for forming an electrode structure of an embodiment, examples of light emitting devices include a light emitting diode (LED) and a semiconductor laser.

Additional features and advantages are described herein, and will be apparent from the following Detailed Description and the figures.

DETAILED DESCRIPTION

The present application will be described in detail with reference to the following Examples and the accompanying drawings, according to an embodiment.

Example 1

Example 1 is directed to the method for forming an electrode structure according to an embodiment and the method for forming a stacked structure according to an embodiment. In Example 1, the light emitting device is composed of a light emitting diode (LED). Consequently, the light emitting device is frequently referred to as "light emitting diode" in the following descriptions.

Figure 7:
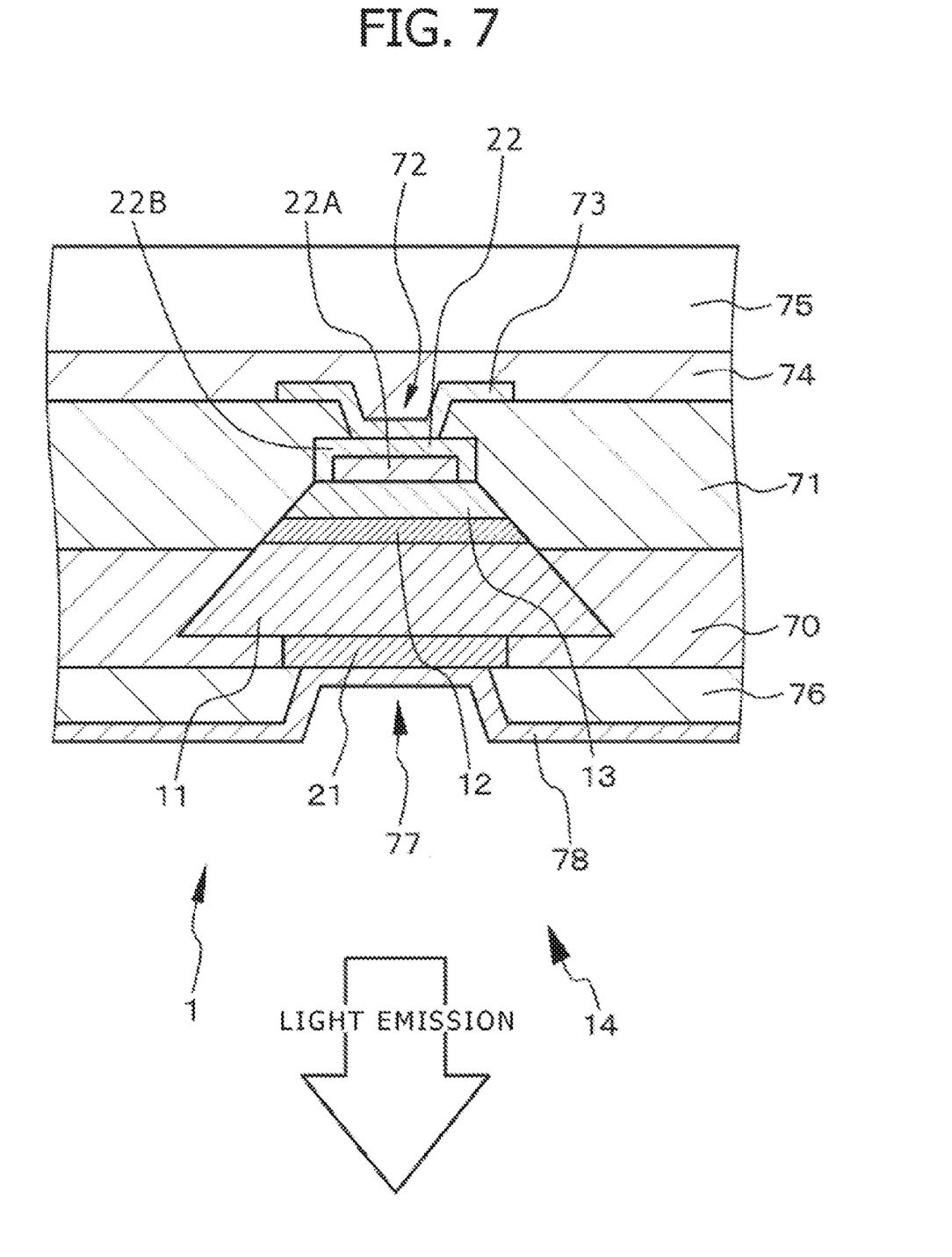
FIG. 7 is a diagrammatic, partially cross-sectional view of the light emitting device finally obtained.

As shown in the diagrammatic, partial end view of FIG. 7, a light emitting diode 1 in Example 1 includes a light emitting layer 14 composed of a stacked structure including a first compound semiconductor layer 11 of a first conduction type (specifically, n-type), an active layer 12, and a second compound semiconductor layer 13 of a second conduction type (specifically, p-type). Hereinafter, the electrode structure or stacked structure obtained by the method in Example 1 is referred to as second electrode 22 or p-side electrode 22. The second electrode 22 having a circular plane form is formed on the second compound semiconductor layer 13 corresponding to the compound semiconductor layer and corresponding to the base. On the other hand, a first electrode (n-side electrode) 21 is formed on the bottom surface of the first compound semiconductor layer 11 (the surface of the first compound semiconductor layer 11 which is not on the side of the interface between the first compound semiconductor layer 11 and the active layer 12) and has a ring shape in plane.

The light emitting layer 14 is composed of a stacked structure including a first compound semiconductor layer 11 composed of AlGaInP doped with Si (AlGaInP:Si), an active layer 12 including a GaInP layer (well layer) and an AlGaInP layer (barrier layer) and having a multiple quantum well structure, and a second compound semiconductor layer 13 composed of AlGaInP doped with Mg (AlGaInP:Mg). For improving the affinity with an electrode, an n-GaAs layer (GaAs:Si) and a p-GaAs layer (GaAs:Mg) can be formed as contact layers. The first electrode (n-side electrode) 21 is composed of a stacked structure of Pd layer/AuGe layer/Au layer, and the second electrode (p-side electrode) 22 is composed of a stacked structure of Ag layer/Ni layer. That is, in the electrode structure (stacked structure), the first material layer 22A is composed of silver (Ag), and the second material layer 22B is composed of nickel (Ni). In the method of production of the light emitting diode 1, the light emitting layer 14 is formed on a substrate 10A, A primary coat layer 10B composed of n-type GaAs is formed on the principal surface of the substrate 10A composed of a GaAs substrate. An AlGaInP layer (not shown) is formed as an etching stop layer between the substrate 10A and the primary coat layer 10B.

In the light emitting diode 1 in Example 1, when an electric current is permitted to flow from the second electrode 22 through the second compound semiconductor layer 13 and active layer 12 toward the first compound semiconductor layer 11 and first electrode 21, the active layer 12 of a quantum well structure is excited by the injection of current to emit light from the entire surface, so that the light passes through the first compound semiconductor layer 13 and is emitted toward outside. That is, the light emitting diode in Example 1 is a light emitting device of type 1.

The method for forming an electrode structure and method for forming a stacked structure in Example 1 are described below with reference to the diagrammatic, partial end views and partially cross-sectional views of a light emitting layer and others of FIGS. 1A to 1D, 2A and 2B, 3A and 3B, 4A and 4B, 5A and 5B, 6, and 7.

Step 100

Figure 1A:
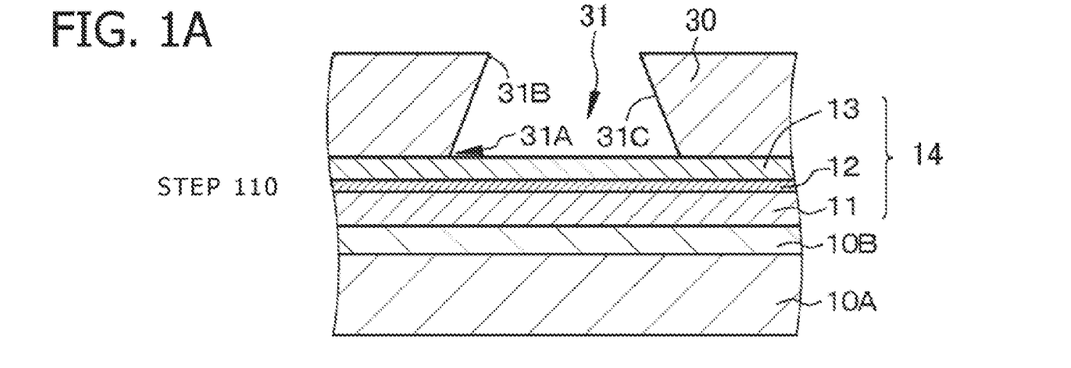
FIGS. 1A to 1D are diagrammatic, partially cross-sectional views of a light emitting layer and others for explaining the method for forming an electrode structure and method for forming a stacked structure in Example 1.
Figure 1B:
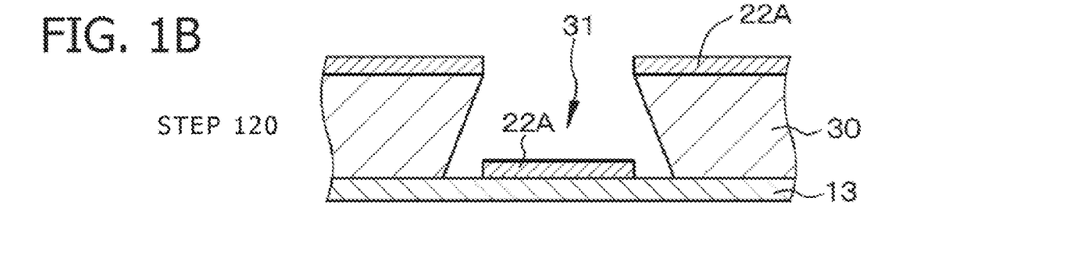
Figure 1C:
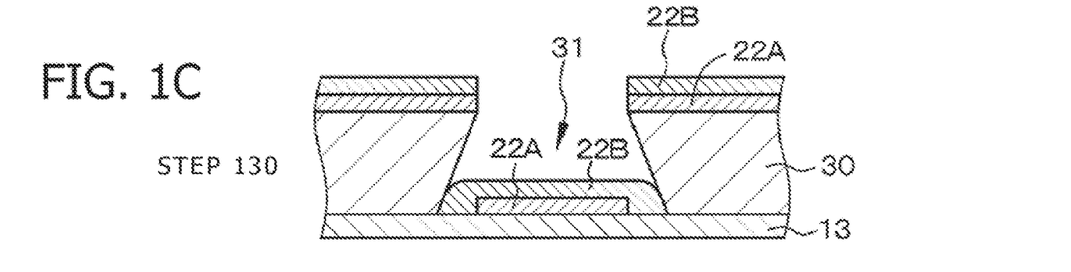

An etching stop layer (not shown) composed of AlGaInP and a primary coat layer 10B composed of n-type GaAs are first successively formed (deposited) by a known MOCVD method on the principal surface of a substrate 10A composed of a GaAs substrate. Then, a first compound semiconductor layer 11, an active layer 12, and a second compound semiconductor layer 13 are successively formed (deposited) by a known MOCVD method on the substrate 10A, more specifically, on the primary coat layer 10B. In some figures, the light emitting layer 14 is indicated by a single layer. In FIGS. 1B and 1C, the substrate is not shown.

Step 110

Next, a mask material layer 30 including an opening 31 having an average top diameter $R_T$ at a top 31B and an average bottom diameter $R_B$ at a bottom 31A (wherein $R_B > R_T$) is formed on the second compound semiconductor layer 13 corresponding to the compound semiconductor layer in the method for forming an electrode structure according to an embodiment and corresponding to the base in the method for forming a stacked structure according to an embodiment. The mask material layer 30 is composed of a photoresist material, and known procedures for forming a resist layer, specifically, deposition of a resist layer by a spin coating method, a baking treatment, an exposure treatment according to a lithography technique, a development treatment, and the like are conducted, thus obtaining a state shown in the diagrammatic, partial end view of FIG. 1A. The photoresist material may be a negative photoresist material, a positive photoresist material, or a negative-positive reversal photoresist material. The opening 31 has the following:

Average top diameter $R_T$=20 μm
Average bottom diameter $R_B$=22 μm.

Each of the top 31B and the bottom 31A has a circular shape in plane, and a sidewall 31C of the opening 31 constitutes an inclined plane such that the bottom area of the opening is larger than the top area. The mask material layer has an average thickness t of 4 μm.

Step 120

Then, a first material layer 22A (specifically, a first material layer 22A composed of Ag which is a conductive material) is deposited on the mask material layer 30 and on a portion of the second compound semiconductor layer 13 exposed through the bottom of the opening 31 by a physical vapor deposition (PVD) method reducing the particle density of a material to be deposited so that the mean free path for collision is long, thus obtaining a state shown in the diagrammatic, partial end view of FIG. 1B. As a PVD method, a vacuum evaporation method mentioned below (specifically, a resistive heating evaporation method or an electron beam heating method) is employed.

Deposition conditions for first material layer 22A
Mean free path: About $1 \times 10^3$ m
Pressure in deposition atmosphere: $1 \times 10^{-5}$ Pa
Deposition rate: 0.2 nm/sec
Thickness on mask material layer: 0.1 μm Step 130

Subsequently, a second material layer 22B (specifically, a second material layer 22B composed of Ni) is deposited on the first material layer 22A on the mask material layer 30, on the first material layer 22A deposited on the bottom of the opening 31, and on a portion of the second compound semiconductor layer 13 exposed through the bottom of the opening 31 by a vapor deposition method other than the physical vapor deposition method, thus obtaining a state shown in the diagrammatic, partial end view of FIG. 1C. As a vapor deposition method, a sputtering method mentioned below is employed.

Deposition conditions for second material layer 22B
Gas: Ar
Mean free path: About $1 \times 10^{-2}$ m
Pressure in deposition atmosphere: 1 Pa
Deposition rate: 0.3 nm/sec
Thickness on mask material layer: 0.3 μm Step 140

Figure 1D:
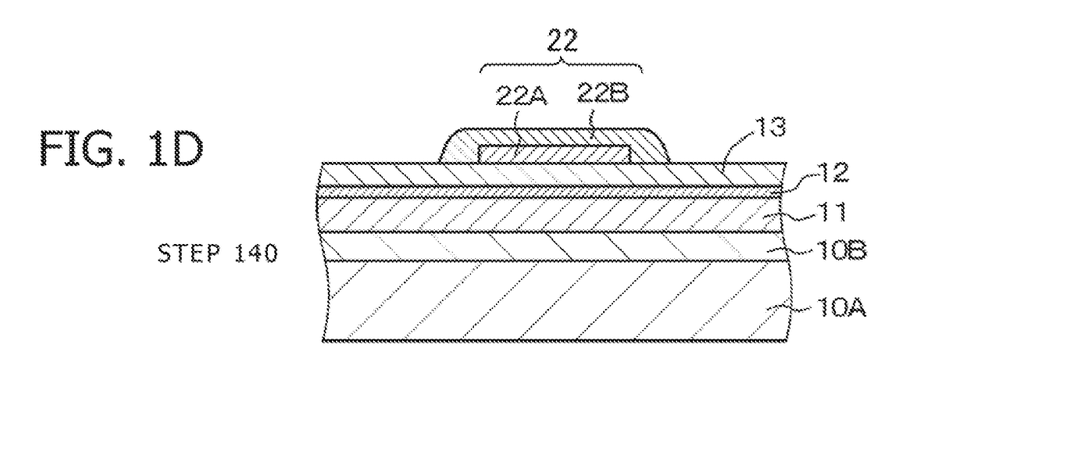
Figure 2A:
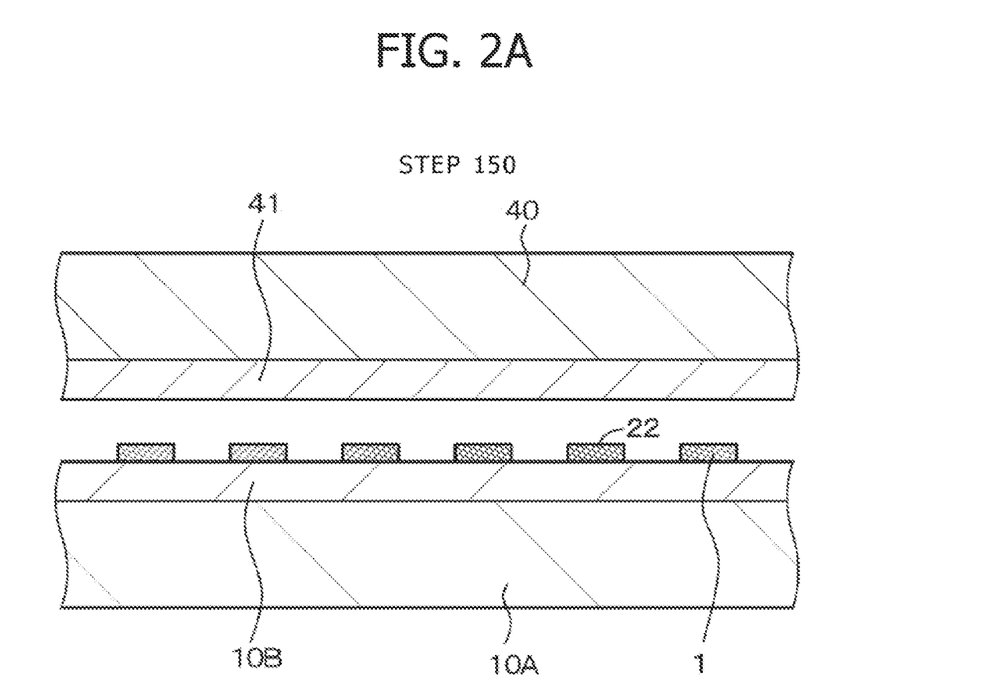
FIGS. 2A and 2B are diagrammatic, partially cross-sectional views of a light emitting layer and others, subsequent to FIG. 1D, for explaining the method for forming an electrode structure and method for forming a stacked structure in Example 1.
Figure 2B:
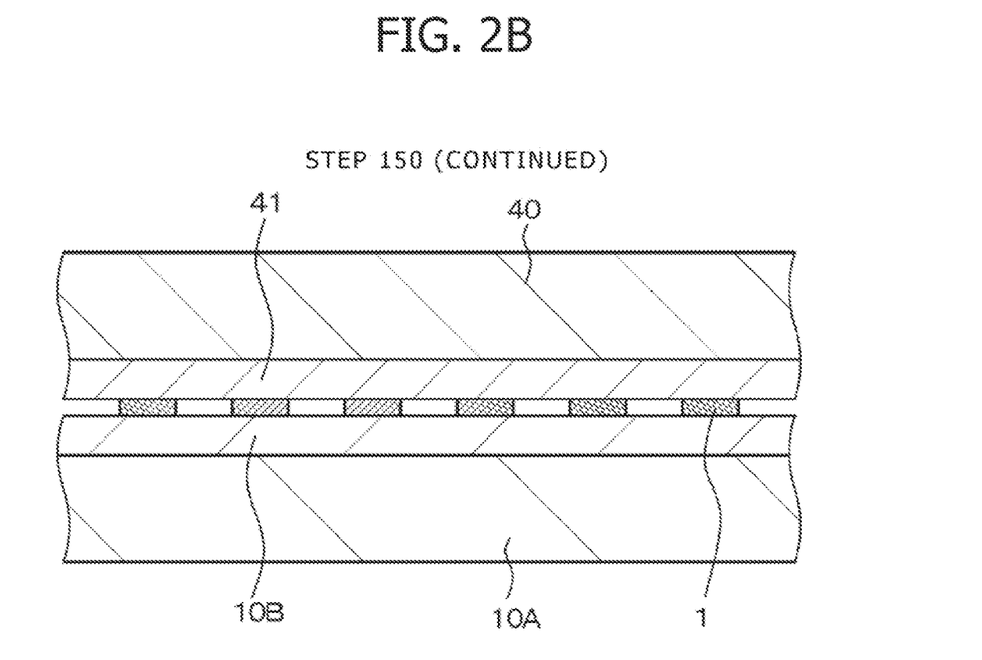

Then, the mask material layer 30 and the first material layer 22A and second material layer 22B deposited on the mask material layer are removed by a lift-off machine using N-methylpyrrolidone (NMP), acetone, and a resist remover. Alternatively, the mask material layer 30 and the first material layer 22A and second material layer 22B deposited on the mask material layer are removed by an ultrasonic method. Further alternatively, they are removed bad a combination of the above methods. Thus a state shown in FIG. 1D is obtained.

The method for forming an electrode structure or method for forming a stacked structure in Example 1 is completed.

Then, the second compound semiconductor layer 13 and active layer 12 are selectively etched so that the first compound semiconductor layer 11 is exposed, and then an insulating layer is formed on the second compound semiconductor layer 13, active layer 12, and exposed first compound semiconductor layer 11, and part of the insulating layer formed on the exposed first compound semiconductor layer 11 is removed, and a first electrode (n-side electrode) is formed, followed by isolation of light emitting diode 1, thus obtaining a light emitting diode 1. Alternatively, when using a conductive substrate 10A, a first electrode (n-side electrode) is formed on the back surface of the substrate 10A, followed by isolation of light emitting diode 1, obtaining a light emitting diode 1. Further alternatively, a light emitting diode 1 may be obtained through the steps described below.

Step 150

Specifically, the light emitting diode 1 is then temporarily fixed to a temporary fixing substrate 40 through the second electrode 22. More specifically, a temporary substrate 40 composed of a glass substrate having formed on the surface a bonding layer 41 composed of an uncured bonding agent is prepared. The light emitting diode 1 and the bonding layer 41 are put together and the bonding layer 41 is cured to temporarily fix the light emitting diode 1 to the temporary fixing substrate 40 (see FIGS. 2A and 2B).

Step 160

Figure 3A:
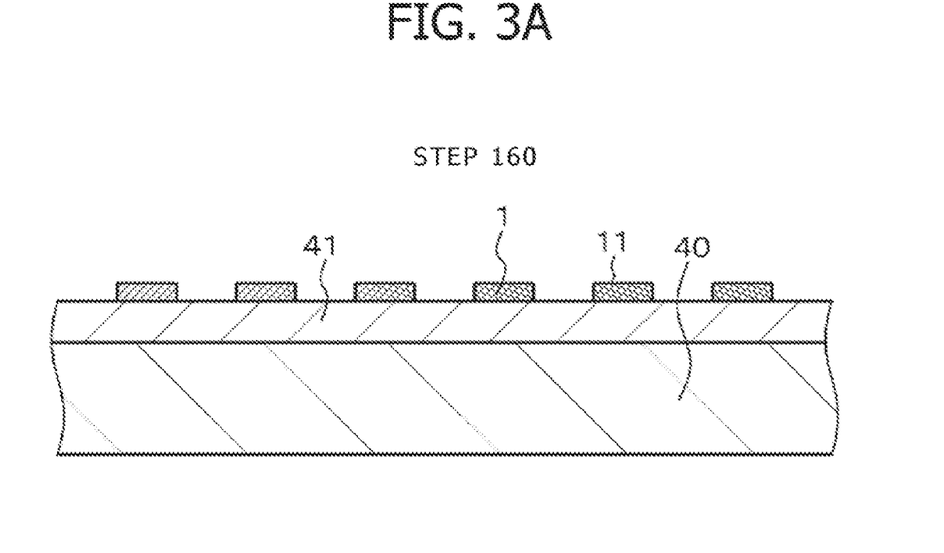
FIGS. 3A and 3B are diagrammatic, partially cross-sectional views of a light emitting layer and others, subsequent to FIG. 2B, for explaining the method for forming an electrode structure and method for forming a stacked structure in Example 1.

Then, the light emitting diode 1 is removed from the substrate 10A and primary coal layer 10B (see FIG. 3A). Specifically, the thickness of the substrate 10A composed of GaAs is reduced by lapping for the back surface of the substrate, and then the substrate 10A is removed by etching the substrate 10A using a mixture of aqueous ammonia and aqueous hydrogen peroxide until the etching stop layer composed of AlGaInP is exposed. Then, the etching stop layer is removed by wet etching using hydrochloric acid at −5° C. as etching liquid, and further the primary coat layer 10B is removed, thus exposing the first compound semiconductor layer 11.

Examples of materials constituting the temporary substrate 40 include a glass substrate, a metallic sheet, an alloy sheet, a ceramic sheet, and a plastic sheet. Examples of methods for temporarily fixing the light emitting device to the temporary substrate 40 include a method using a bonding agent, a metal bonding method, a semiconductor bonding method, and a metal-semiconductor bonding method. Examples of methods for removing the substrate 10A from the light emitting device include an etching method, a laser ablation method, and a heating method.

Step 170

Next, a first electrode 21 is formed on the bottom surface of the exposed first compound semiconductor layer 11. Specifically, in accordance with a lithography technique, a resist layer is formed on the entire surface and an opening is formed in the resist layer at a portion on the bottom surface of the first compound semiconductor layer 11 on which the first electrode 21 will be formed. Then, a first electrode 21 composed of a multilayer structure film including, e.g., Au/Pt/Ti/Au/AuGe/Pd stacked in this order is formed on the entire surface by a PVD method, such as a vacuum evaporation method or a sputtering method, followed by removal of the resist layer and the multilayer structure film on the resist layer.

Step 180

A relay substrate 50 having formed thereon a pressure-sensitive adhesive layer 51, composed of a silicone rubber, having a slight adhesive property, and a mounting substrate 60 composed of a glass substrate having preliminarily formed at a predetermined position an alignment mark (not shown) composed of a metal thin film or the like and having formed on its surface a bonding agent layer 61 composed of an uncured photosensitive resin are prepared.

The bonding agent layer 61 may basically be composed of any material as long as the material exhibits bonding properties by a certain method, for example, the material exhibits bonding properties by irradiation with energy ray, such as light (particularly, ultraviolet light or the like), radiation (e.g., X-ray), or an electron beam, or the material exhibits bonding properties by application of heat or pressure. Examples of materials, which easily form a bonding agent layer and exhibit bonding properties, include resin bonding agents, particularly, photosensitive bonding agents, thermosetting bonding agents, and thermoplastic bonding agents. For example, when a photosensitive bonding agent is used, the bonding agent layer is heated by irradiation with light or ultraviolet light or heating to exhibit bonding properties. When a thermosetting bonding agent is used, the bonding agent layer is heated by irradiation with light or the like to exhibits bonding properties. When a thermoplastic bonding agent is used, part of the bonding agent layer is melted and flowed by selectively heating the part by irradiation with light or the like. Another example of the bonding agent layer includes a pressure-sensitive bonding agent layer (composed of, e.g., an acrylic resin).

Figure 3B:
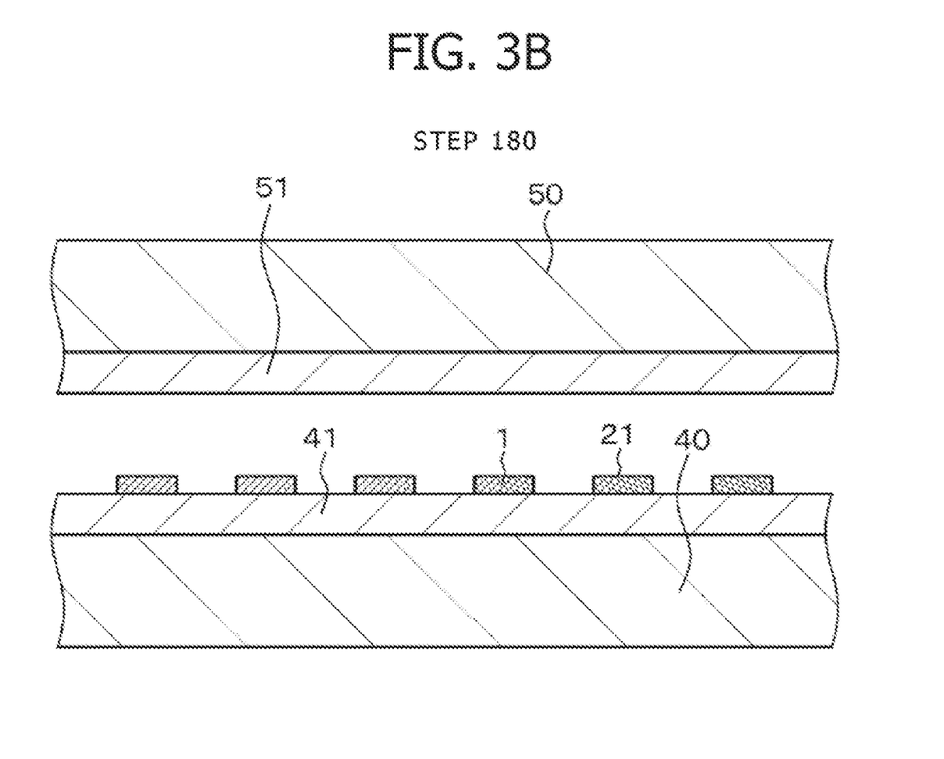
Figure 4A:
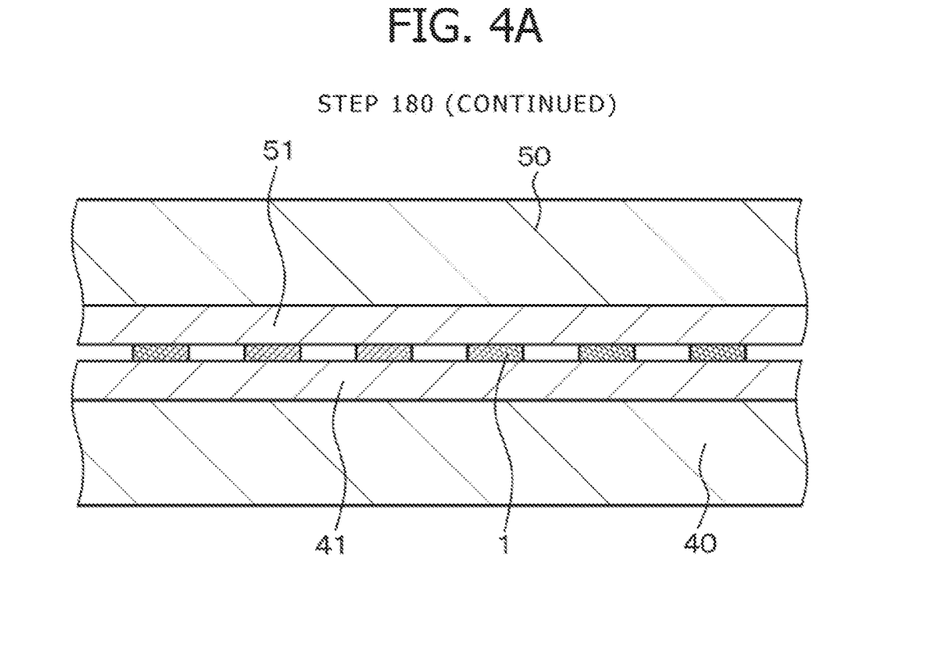
FIGS. 4A and 4B are diagrammatic, partially cross-sectional views of a light emitting layer and others, subsequent to FIG. 3B, for explaining the method for forming an electrode structure and method for forming a stacked structure in Example 1.
Figure 4B:
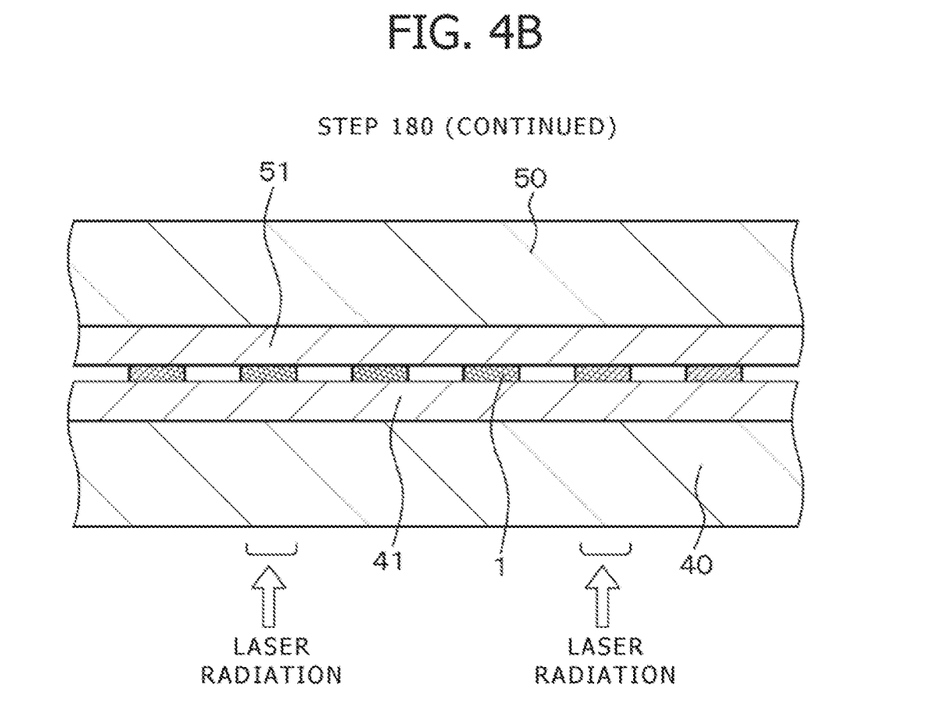

The pressure-sensitive adhesive layer 51 is pressed to the light emitting diode 1 in an array form (two-dimensional matrix form) remaining on the temporary fixing substrate 40 (see FIGS. 3B and 4A). Examples of materials constituting the relay substrate 50 include a glass sheet, a metallic sheet, an alloy sheet, a ceramic sheet, a semiconductor substrate, and a plastic sheet. The relay substrate 50 is held by a positioning apparatus (not shown). The relationship in respect of position between the relay substrate 50 and the temporary fixing substrate 40 is controlled by operating the positioning apparatus. Then, the back surface of the temporary substrate 40 is irradiated with, for example, excimer laser for the light emitting diode 1 to be mounted (see FIG. 4B). Laser ablation is caused, so that the light emitting diode 1 irradiated with excimer laser is removed from the temporary substrate 40. Then, the relay substrate 50 and the light emitting diode 1 are separated from each other, so that the light emitting diode 1 removed from the temporary substrate 40 adheres to the pressure-sensitive adhesive layer 51 (see FIG. 5A).

Figure 5A:
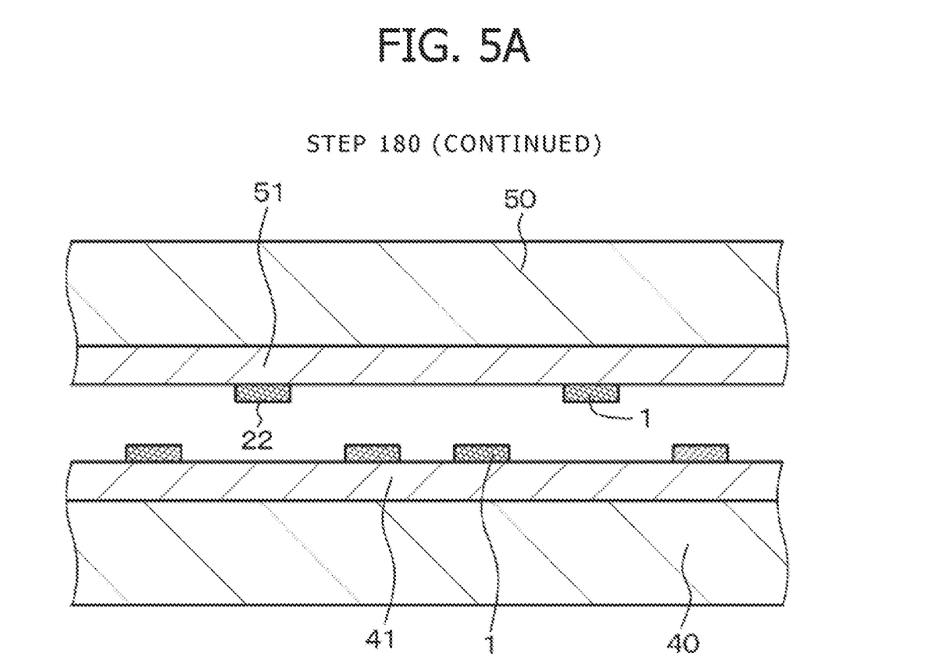
FIGS. 5A and 5B are diagrammatic, partially cross-sectional views of a light emitting layer and others, subsequent to FIG. 4B, for explaining the method for forming an electrode structure and method for forming a stacked structure in Example 1.
Figure 5B:
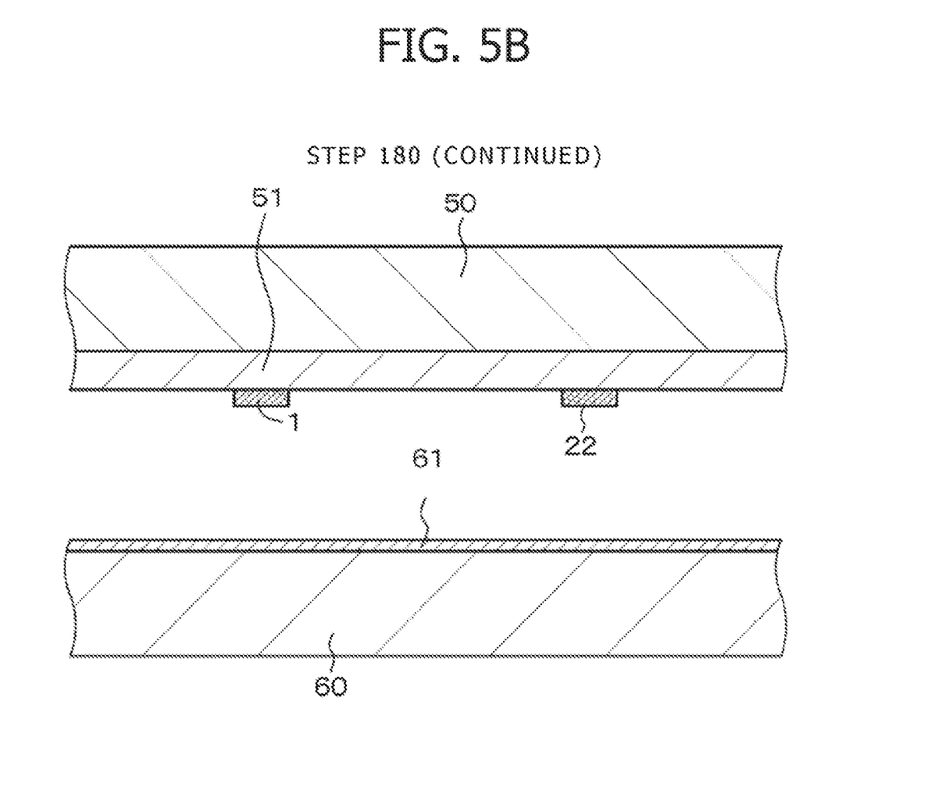
Figure 6:
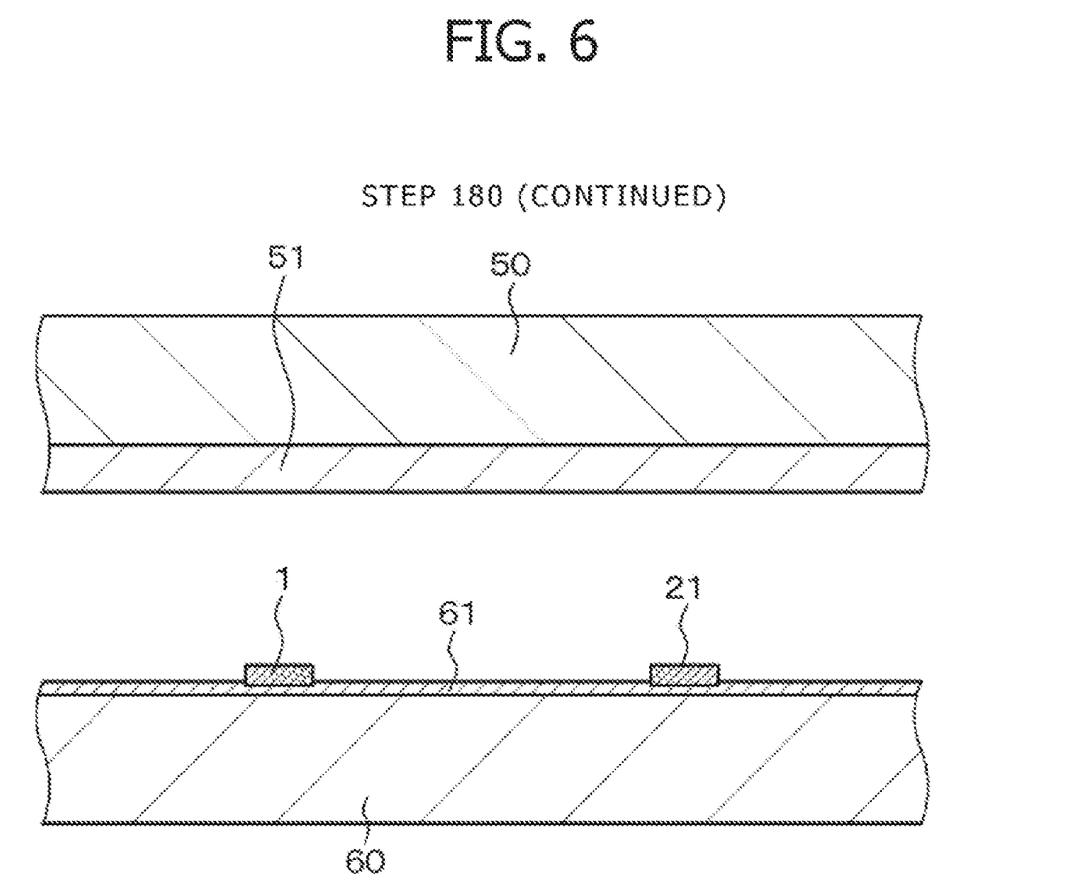
FIG. 6 is a diagrammatic, partially cross-sectional view of a light emitting layer and others, subsequent to FIG. 5B, for explaining the method for forming an electrode structure and method for forming a stacked structure in Example 1.

Then, the light emitting diode 1 is disposed on (moved or transferred to) the bonding agent layer 61 (FIG. 5B and FIG. 6). Specifically, the light emitting diode 1 is removed from the relay substrate 50 and disposed on the bonding agent layer 61 on the mounting substrate 60 using the alignment mark formed on the mounting substrate 60 as a guide. The light emitting diode 1 weakly adheres to the pressure-sensitive adhesive layer 51, and therefore, when the relay substrate 50 is moved in the direction opposite to the mounting substrate 60 in such a state that the light emitting diode 1 is in contact with (pressed against) the bonding agent layer 61, the light emitting diode 1 remains on the bonding agent layer 61. Further, when the light emitting diode 1 is embedded deeply in the bonding agent layer 61 using a roller or the like, the light emitting diode can be mounted on the mounting substrate 60.

The above-described method using the relay substrate 50 is referred to as "step-transfer method" herein, for convenience. By repeating the step transfer method desired times, the desired number of light emitting diodes 1 adheres to the pressure-sensitive adhesive layer 51 in a two-dimensional matrix form and are transferred onto the mounting substrate 60. Specifically, in Example 1 in the first step-transfer, 160×120 light emitting diodes 1 in a two-dimensional matrix form adhere to the pressure-sensitive adhesive layer 51 and are transferred onto the mounting substrate 60. Accordingly, by repeating the step transfer method {(1,920×1,080)/(160×120)=} 108 times, 1,920×1,080 light emitting diodes 1 may be transferred onto the mounting substrate 60. By, repeating the above procedure three times, the predetermined number of red light-emitting diodes, green light-emitting diodes, and blue light-emitting diodes may be mounted on the mounting substrate 60 at predetermined intervals or pitches.

Then, the bonding agent layer 61, composed of a photosensitive resin, having the light emitting diode 1 disposed thereon is irradiated with ultraviolet light to cure the photosensitive resin constituting the bonding agent layer 61, so that the light emitting diode 1 is fixed to the bonding agent layer 61. Then, the light emitting diode 1 is temporarily fixed to a second temporary substrate through the first electrode 21. Specifically, a second temporary substrate composed of a glass substrate having formed on the surface a bonding layer 70 composed of an uncured bonding agent is prepared. The light emitting diode 1 and the bonding layer 70 are put together and the bonding layer 70 is cured to temporarily fix the light emitting diode 1 to the second temporary substrate. Then, the bonding agent layer 61 and mounting substrate 60 are removed from the light emitting diode 1 by an appropriate method, thus exposing the second electrode 22 of the light emitting diode 1.

Step 190

Next, a second insulating layer 71 is formed on the entire surface, and an opening 72 is formed in the second insulating layer 71 above the second electrode 22 of the light emitting device, and a second wiring 73 is formed over the second electrode 22, opening 72, and second insulating layer 71. The second wiring 73 extends in the vertical direction on the plane of the figure. Then, the second insulating layer 71 including the second wiring 73 and a supporting substrate 75 composed of a glass substrate are put together through a bonding layer 74 to fix the light emitting device 1 to the supporting substrate 75. Then, for example, the back surface of the second temporary fixing substrate is irradiated with, e.g., excimer laser. Laser ablation is caused, so that the light emitting diode 1 irradiated with excimer laser is removed from the second temporary fixing substrate, thus exposing the first electrode 21 of the light emitting diode 1. Next, a first insulating lawyer 76 is formed on the entire surface, and an opening 77 is formed in the first insulating layer 76 above the first electrode 21 of the light emitting device 1, and a first wiring 78 is formed over the first electrode 21, opening 77, and first insulating layer 76. The first wiring 78 extends in the horizontal direction on the plane of the figure. This state is shown in the diagrammatic, partially cross-sectional view of FIG. 7. The first wiring and second wiring are connected to a driving circuit by an appropriate method, thus obtaining a light emitting diode and further a display device including the light emitting diode. In the light emitting diode 1, light generated by the active layer 12 is emitted downwards as viewed in FIG. 7.

Example 2

Figure 8A:
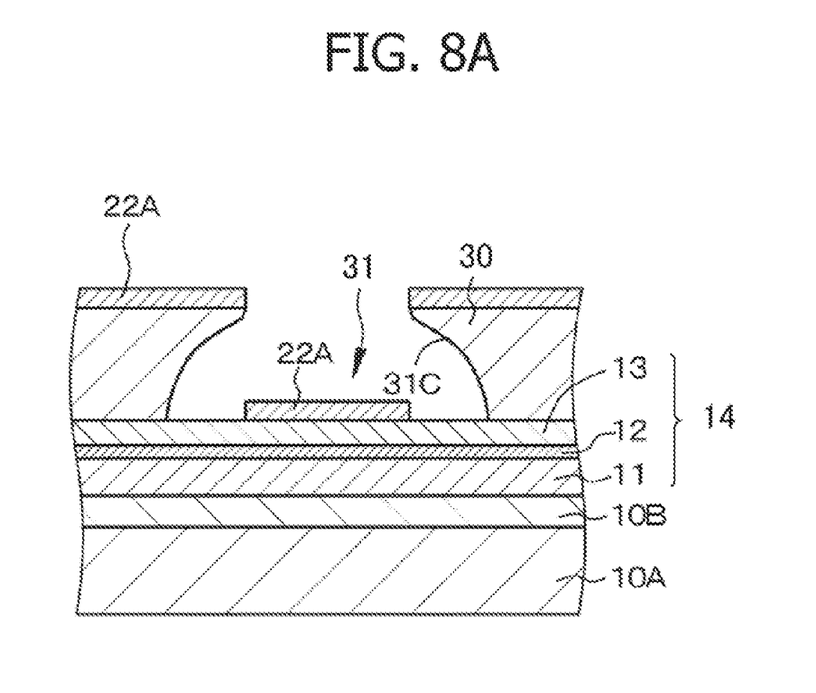
FIG. 8A is a diagrammatic, partial end view of a light emitting layer and others in Example 2 in Which the mask material layer is subjected to oxygen plasma treatment between the step 120 and the step 130.

Example 2 is a modification of Example 1. In Example 2 the mask material layer 30 is subjected to oxygen plasma treatment under the conditions shown below between the step 120 and the step 130 (see FIG. 8A). When the mask material layer 30 is subjected to oxygen plasma treatment, the sidewall 31C of the opening 31 goes back, so that the mask material layer 30 and the first material layer 22A and second material layer 22B deposited on the mask material layer may be easily removed in the step 140. The oxygen plasma treatment may be conducted between the step 130 and the step 140, or between the step 120 and the step 130 and between the step 130 and the step 140.

Oxygen plasma treatment

Mode: RIE

RF power: 300 W

Gas: 100% Oxygen gas

Time: 5 minutes

Example 3

Figure 9:
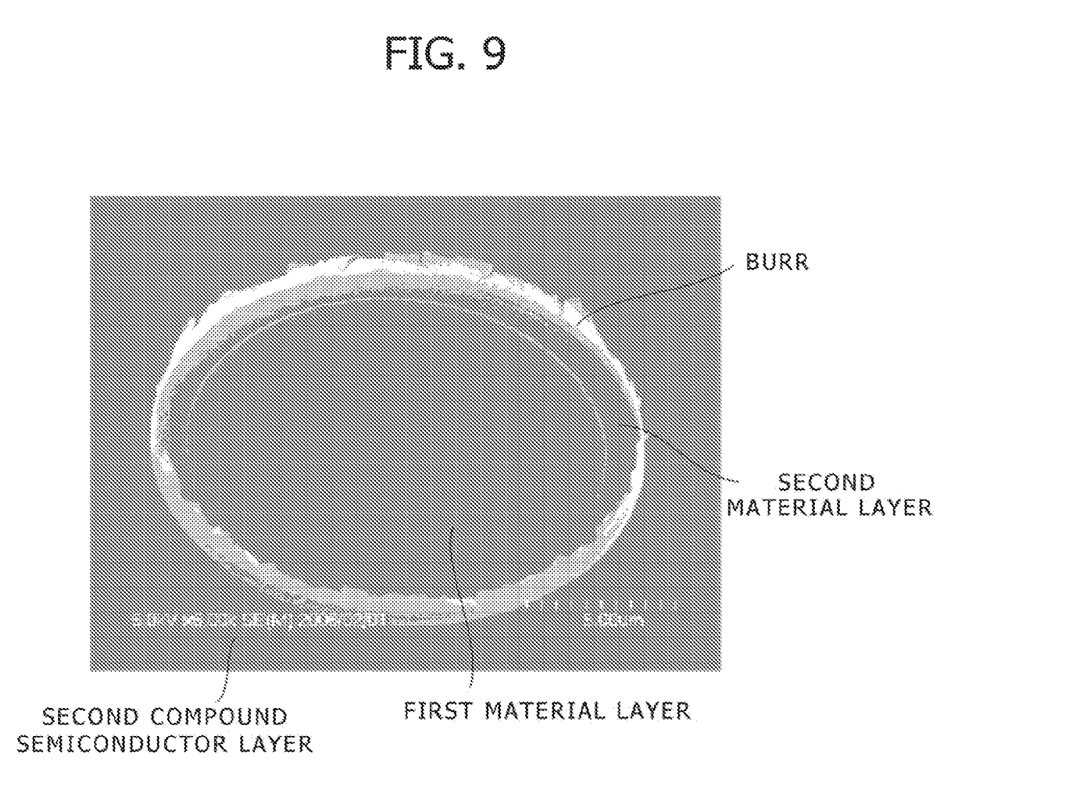
FIG. 9 is an electron photomicrograph showing a state in which a kind of burr remains at the edge of the second material layer after completion of the step 140 in Example 1.

Example 3 is also a modification of Example 1. There is a possibly that a kind of burr remains at the edge of the second material layer after completion of the step 140 (see the electron photomicrograph of FIG. 9). In FIG. 9, the portion indicated by "FIRST MATERIAL LAYER" is actually a portion of the stacked structure including the first material layer and the second material layer. On the other hand, the portion indicated by "SECOND MATERIAL LAYER" is a portion comprised solely of the second material layer. The portion indicated by "BURR" shows a state in which the edge of the second material layer curls up. In this case, burrs may be removed by scrubbing, polishing, such as CMP, a plasma treatment or soft etching. Thus, a problem in that burrs adhere as residues to an undesired portion of the light emitting device may be surely prevented.

Hereinabove, embodiments is described with reference to the preferred Examples, but the present application is not limited to the above Examples, and can be changed or modified based on the technical concept. The values, materials, constructions, structures, forms, substrates, raw materials, methods, and others mentioned in the Examples are merely examples, and values, materials, constructions, structures, forms, substrates, raw materials, methods, and others different from them may be used if desired. In the Examples, the light emitting diode is a light emitting diode of type 1, but a light emitting diode of type 2 may be used. The method for forming a stacked structure according to an embodiment may be applied to protection of, for example, a wiring, a wiring layer, an electrode, or an electrode pad composed of a metal, such as silver or copper, or an alloy thereof.

Figure 8B:
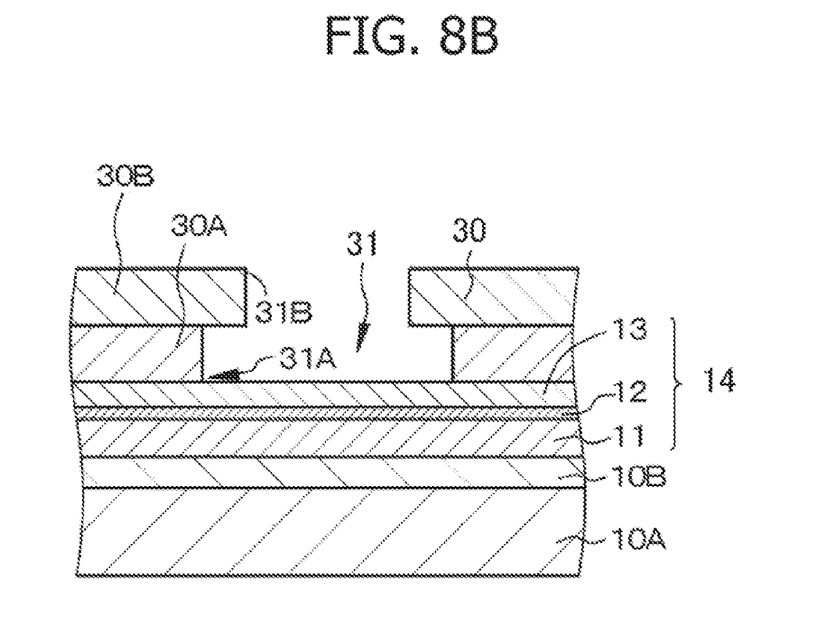
FIG. 8B is a diagrammatic, partial end view of a light emitting layer and others formed using a mask material layer having a stacked structure.

In the Examples, the mask material layer 30 having a single-layer structure is used, but a mask material layer having a stacked structure including, for example, a first layer 30A composed of an $SiO_2$ layer and a second layer 30B composed of a metal layer shown in FIG. 8B can be used. When using the mask material layer having a multi-layer structure, the top diameter and bottom diameter of the opening may be more easily controlled.

According to an embodiments, by a method in which a mask material layer having an opening such that the top of the opening is smaller than the bottom of the opening is formed only once, a first material layer and a second material layer covering the first material layer may be formed on the compound semiconductor layer or base exposed through the bottom of the opening. Accordingly, unlike a known technique, the method of embodiments need not employ two lift-off procedures, and hence requires no operation for relative alignment of the photomask with high accuracy in each lift-off procedure. An electrode structure or stacked structure including the first material layer and second material layer may be formed without a need to optimize the accuracy of relative alignment for the first material layer and second material layer, and the formation of the first material layer and second material layer may be simplified and reduced in cost. The degree of covering of the first material layer by the second material layer is determined by controlling the values of $R_B$ and $R_T$, and the values of $R_B$ and $R_T$ may be relatively easily controlled. Embodiments is especially effective in forming an electrode structure or stacked structure having a size as fine as a size on the order of several tens micrometer or smaller.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for forming an electrode structure in a light emitting device, the method comprising the steps of:
    (A) forming a mask material layer on a compound semiconductor layer, the mask material layer including an opening having an average top diameter $R_T$ and an average bottom diameter $R_B$ (wherein $R_B > R_T$);
    (B) depositing a first material layer composed of a conductive material on the mask material layer and on a portion of the compound semiconductor layer exposed through the bottom of the opening by a physical vapor deposition method reducing the particle density of a material to be deposited so that the mean free path for collision is long;
    (C) depositing a second material layer on the first material layer on the mask material layer, on the first material layer deposited on the bottom of the opening, and on a portion of the compound semiconductor layer exposed through the bottom of the opening by a vapor deposition method other than the physical vapor deposition method;
    (D) removing the mask material layer and the first and second material layers deposited on the mask material layer, whereby the electrode structure composed of the first material layer and the second material layer is formed; and
    wherein the physical vapor deposition method in the step (B) is a vacuum evaporation method, and the vapor deposition method in the step (C) is a sputtering method or a chemical vapor deposition method.

2. The method according to claim 1, wherein the mask material layer is composed of a photoresist material or an inorganic material.

3. A method for forming a stacked structure, the method comprising the steps of:
    (A) forming a mask material layer on a base, the mask material layer including an opening having an average top diameter $R_T$ and an average bottom diameter $R_B$ (wherein $R_B > R_T$);
    (B) depositing a first material layer on the mask material layer and on a portion of the base exposed through the bottom of the opening by a physical vapor deposition method reducing the particle density of a material to be deposited so that the mean free path for collision is long;
    (C) depositing a second material layer on the first material layer on the mask material layer, on the first material layer deposited on the bottom of the opening, and on a portion of the base exposed through the bottom of the opening by a vapor deposition method other than the physical vapor deposition method;
    (D) removing the mask material layer and the first and second material layers deposited on the mask material layer, whereby the stacked structure composed of the first material layer and the second material layer is formed; and
    wherein the physical vapor deposition method in the step (B) is a vacuum evaporation method, and the vapor deposition method in the step (C) is a sputtering method or a chemical vapor deposition method.

4. The method according to claim 3, wherein the mask material layer is composed of a photoresist material or an inorganic material.

* * * * *